United States Patent

Vetter et al.

[11] Patent Number: 5,911,863
[45] Date of Patent: Jun. 15, 1999

[54] METHOD OF MANUFACTURING PLASTIC FOILS WHICH ARE ELECTRICALLY CONDUCTIVE IN ONE DIRECTION BUT INSULATING IN OTHER DIRECTIONS

[75] Inventors: Johann Vetter, Darmstadt; Dobri Dobrev, Sofia; Norbert Angert, Weiterstadt, all of Germany

[73] Assignee: Gesellschaft für Schwerionenforschung mbH, Darmsladt, Germany

[21] Appl. No.: 08/984,519

[22] Filed: Dec. 3, 1997

[30] Foreign Application Priority Data

Dec. 7, 1996 [DE] Germany ............... 196 50 881

[51] Int. Cl.⁶ .................................................. C25D 5/02
[52] U.S. Cl. .................... 205/103; 205/104; 205/118; 205/122; 205/148; 205/161; 205/205; 205/223; 439/66
[58] Field of Search ................... 205/103, 104, 205/118, 122, 148, 161, 205, 223; 439/66, 91, 591

[56] References Cited

U.S. PATENT DOCUMENTS

| | | | |
|---|---|---|---|
| 3,385,773 | 5/1968 | Frantzen | 205/125 |
| 4,003,621 | 1/1977 | Lamp | 439/586 |
| 4,613,351 | 9/1986 | Spohr | 65/22 |
| 4,668,957 | 5/1987 | Spohr | 343/812 |
| 5,071,359 | 12/1991 | Arnio et al. | 439/91 |
| 5,262,226 | 11/1993 | Yoshida | 428/209 |
| 5,509,203 | 4/1996 | Yamashita | 29/879 |
| 5,818,700 | 10/1998 | Purinton | 361/760 |

*Primary Examiner*—Kathryn Gorgos
*Assistant Examiner*—William T. Leader
*Attorney, Agent, or Firm*—Klaus J. Bach

[57] ABSTRACT

In a method of manufacturing foils of plastic material which are electrically conductive in a transverse direction, but not in the plane of the foil wherein micropassages are formed in the foil by etching nucleus traces which are generated by exposure to a heavy ion beam, conductive layers are deposited on one side of the foil and the micropassages are filled by electrolytic metal ion depositions from the other side until caps are formed on the passages. After dissolving the two conductive layers, the steps are repeated to form caps also on the passages at the other side of the foil so as to provide for good contacting capabilities at both sides of the foil.

5 Claims, 3 Drawing Sheets

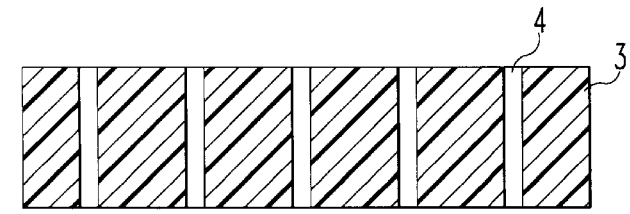
*FIG.1.1*
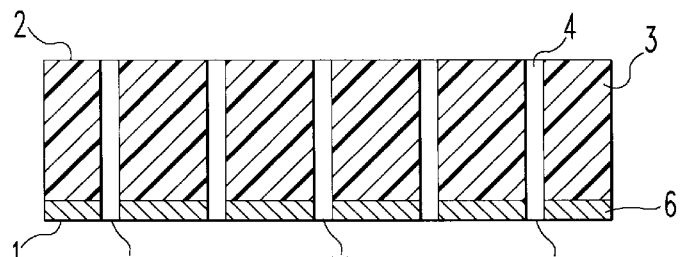
*FIG.1.2*
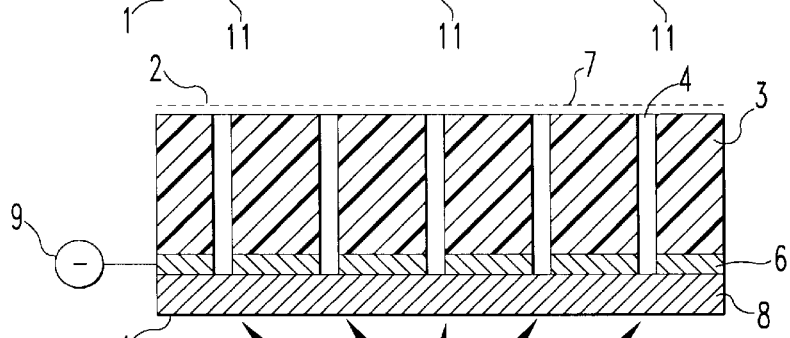
*FIG.1.3*
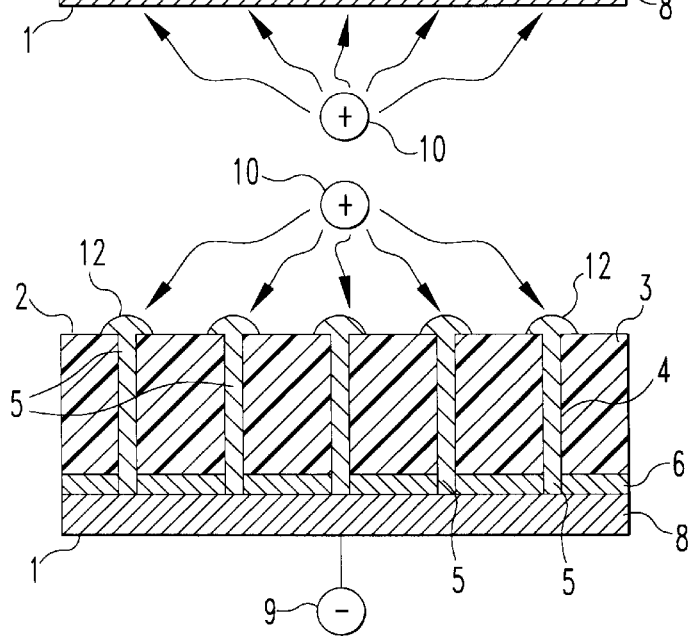
*FIG.1.4*
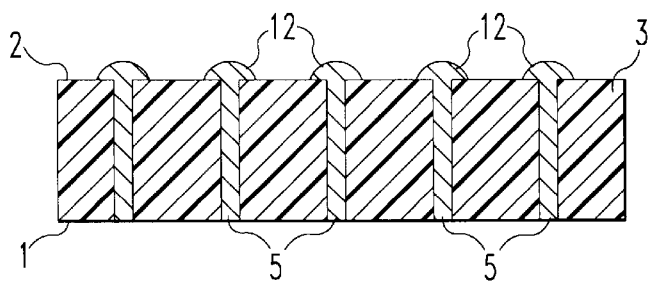
*FIG.1.5*

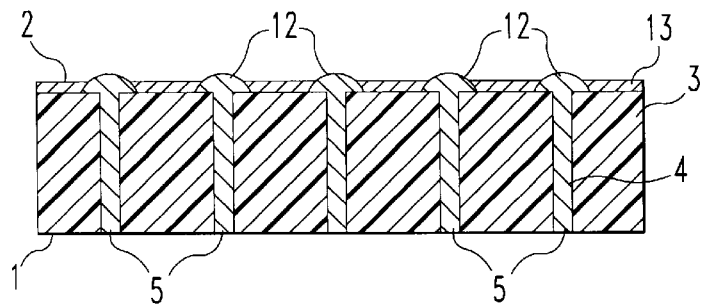
*FIG.1.6*
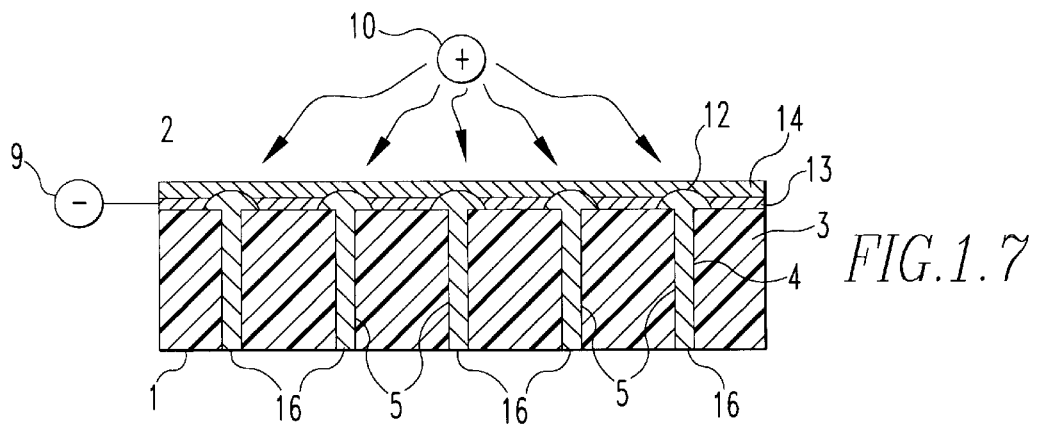
*FIG.1.7*
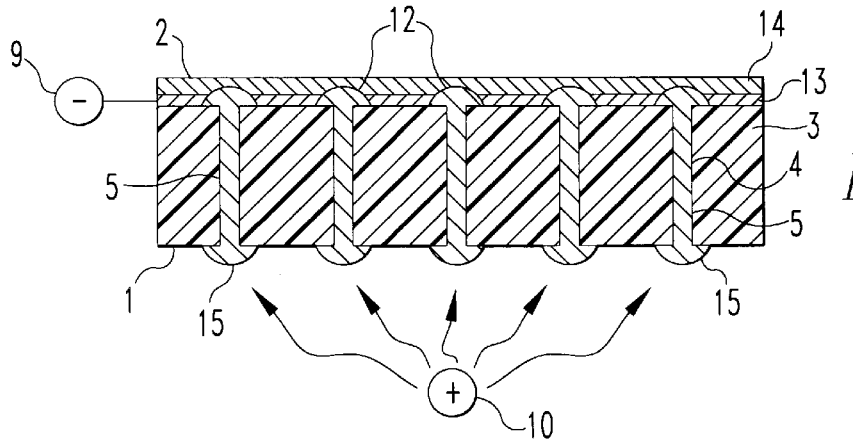
*FIG.1.8*
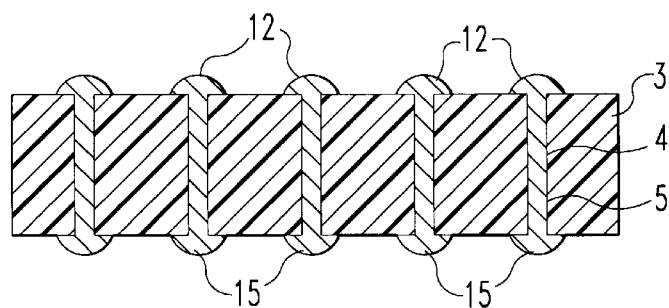
*FIG.1.9*

METHOD OF MANUFACTURING PLASTIC FOILS WHICH ARE ELECTRICALLY CONDUCTIVE IN ONE DIRECTION BUT INSULATING IN OTHER DIRECTIONS

BACKGROUND OF THE INVENTION

The invention relates to a method of manufacturing foils of plastic or other insulating materials, which are electrically conductive and well contactable in the z direction, wherein the z-direction represents the foil thickness in a direction normal to the foil surface or at a certain angle thereto and the x/y direction represents the lateral foil extension and the foil includes micro-passages formed by etching nucleus traces such as heavy ions, and filling the micropassages with metallic filaments. Such foils can be used for interconnecting electronic building components.

A method of producing solid bodies with those properties is known, for example from DE Patent No. 3 337 049. However, with the method described therein only solid bodies of metal-supersaturated glazes can be made, which are sensitive to breakage and are not bendable. Furthermore, it is difficult to provide for contacts on the surface of the solid bodies with the metallic fibers disposed in the glass since the fibers end in the surface.

It is the object of the present invention to provide a method with which electrically selectively conductive foils of plastic material of a thickness of up to 100 $\mu$m and more can be manufactured, which have a uniform electric conductivity in the z-direction over surface areas of several centimeters of length. It should further be easy to contact the foils at both sides and they should have insulating properties in the x/y directions that is in the plane of the foil even in small partial sections.

SUMMARY OF THE INVENTION

In a method of manufacturing foils of plastic material which are electrically conductive in a transverse direction, but not in the plane of the foil wherein micropassages are formed in the foil by etching nucleus traces which are generated by exposure to a heavy ion beam, conductive layers are deposited on one side of the foil and the micropassages are filled by metal ion depositions from the other side until caps are formed on the passages. After dissolving the two conductive layers, the steps are repeated to form caps also on the passages at the other side of the foil so as to provide for good contacting capabilities at both sides of the foil.

Detail of the method according to the invention will become apparent from the following description thereof on the basis of the accompanying drawings.

BRIEF DESCRIPTION OF THE DRAWINGS

FIGS. 1.1 to FIG. 1.9 serve to illustrate the method steps according to the invention and, FIG. 2 and FIG. 3 show a foil made by the method according to the invention, the surface being shown enlarged by scanning microscopy.

DESCRIPTION OF THE METHOD

Figure 2:
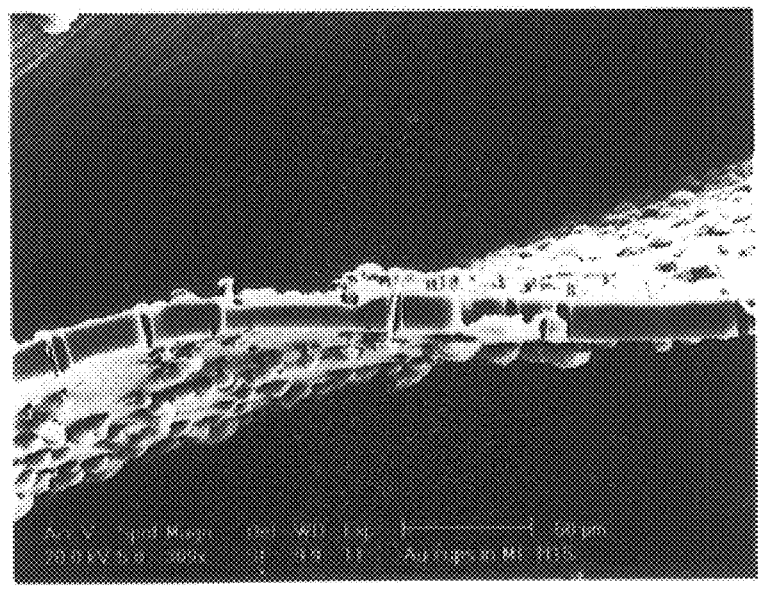

The invention resides in a method for the manufacture of foils 3 of plastic or other insulating materials such as mica, which are electrically conductive in the z-direction (normal to the plane of the foil), but are electrically insulating in the x/y directions (in the plane of the foil). The z-direction extends essentially normal but it may also extend at some angle to a normal on plane of the foil and the x/y directions determine the lateral surface extension of the foil. The foil includes micro openings or passages 4 formed by etching the traces of nuclei such as heavy ions, which openings or passages are filled with metallic filaments. FIGS. 1.1 to 1.9 show schematically the method steps b) to k) in a cross-sectional area of a foil. However, step a) is not shown.

The first step a) resides in the irradiation in the z-direction of the foil 3 by a beam of high energy radiation, for example, by a beam of heavy ions, which fully penetrate the foil. This step is not described here in detail as it represents state-of-the-art. The type of ions, their energy and density can be selected depending on the foil material and its thickness. Important is only that the resulting nucleus traces extend fully through the foil 3 and remain latent after irradiation.

In the next step b as marked by FIG. 1.1 micropassages 4 are formed in the foil 3 by etching the nucleus traces formed in the foil until the micropassages have the desired diameter of the metallic filaments 5 to be formed (FIG. 1.4). The etching procedure parameters such as etching duration, etching medium, density, temperature and other parameters again can be freely selected depending on the foil material and its thickness. Important is however that the etched passages remain clearly separated from one anther and passage overlapping is avoided as much as possible.

Subsequently, in a step C as indicated in FIG. 1.2 an electrically conductive first layer 6 is applied to one side 1 of the matrix, that is, the foil 3 with the micropassages 4. In the process, the openings 11 of the micropassages 4 remain open and the layer 6 does not enter into the micropassages 4. This layer 6 is, with about $\frac{1}{10}$ $\mu$m thickness, relatively thin, it is electrically conductive and it consists of a metal, which does not easily oxidize and has good electric conductivity. The layer 6 is a base layer for the later galvanic buildup. Then, in step d) (FIG. 1.3), the foil 3 with the micropassages 4, is covered on the opposite side 2 with an insulating cover foil 7 in order to prevent the material which is subsequently galvanically deposited on the thin layer 6 from growing from the one side 1 into the micropassages 4, that is, to prevent a contact between the other side 2 and the cathode at the bottom of an electrochemical cell whose anode is in the upper area.

In the subsequent step e), a second conductive metal layer 8 of several $\mu$m is applied to the first layer 6 at said one side 1 of the foil 3. This is achieved by galvanic deposition from an electrolyte bath from the other side 2 wherein the first layer 6 is used as a cathode 9. The openings 11 of the micropassages 4 are closed by growth of the metal layer 8 on the one side; the micropassages 11, however, remain open since they are closed at the other side 2 by the cover foil 7. As mentioned, galvanic deposition occurs in an electrochemical cell which consists of a container whose bottom or lower part is connected as a cathode or, respectively, which forms the cathode in which the electrolyte is located. The side walls of such a container consist of Teflon. The anode 10 is disposed in the electrolyte within the housing and is shown in the figures only schematically. The step e) is performed within the housing in such a way that the one side 1 of the foil is directed toward the anode, but the base layer 6 is connected as the cathode 9 by electrically connecting it to the cathode of the container. The other, that is, the opposite covered side of the foil 3 is remote from the anode and is not affected by this method step. The deposition of the layer 8 can be controlled in a wide range by the selection of the electrochemical parameters.

After the thick layer 8 is provided the cover foil 7 on the other side 2 of the foil 3 is removed in a step f) and the foil 3 is turned over in the container so that the other side 2 is disposed adjacent the anode 10. Galvanic deposition of metal ions from the electrolyte in the micropassages occurs now from the other side 2 opposite the thick layer 8 wherein the layer 8 serves as cathode. The deposition step is performed until the micropassages 4 are completely filled with metal forming filaments 5 extending beyond the openings of the passages 4 on the other side 2 of the foil 3 where they form caps 12 which however are not in contact with one another. The stable strong additional metal layer 8 serves as a support on which the metal filaments can start to grow in the micropassages 4. Without the metal layer 8 the growth of the metal filaments in the foil 3 may start at the walls of the passages 4 and the growth would be uneven.

Then, in a step g) (FIG. 1.5), the layers 6 and 8 deposited with the steps c) and e) are dissolved in another container in such a way that the metal filaments 5 in the micropassages 4 and the caps 12 remain. This solution process can be controlled by the selection of the parameters of the solvent whereby then a foil with metal filament and caps 12 on the other side 2 of the foil 3 is provided.

On this other side 2 with the caps 12 an additional conductive starter layer 13 is deposited in a step h), for example, by sputtering or vapor deposition, the starter layer 13 extending over the caps 12 and electrically interconnecting the caps 12.

Then in a step i), a second thicker conductive layer 14 is applied to the layer 13 with the caps 12, which is now connected as a cathode. This is done like in steps f) and h) by galvanic deposition from an electrolyte from the side of the caps. The deposition occurs similar as in step e); the foil 3 is arranged in a container in such a way that the layer 13 is directed toward the anode 10 and is connected as the cathode 9.

Once the layer 14, is formed, in the next step j), metal ions out of the electrolyte are deposited on the ends 16 of the metal filaments in the passages 4 on the side 1 in order to provide them also with caps 15, which are not in contact with one another. This is done again in the container by connecting the layer 14 on the finished foil side, which is disposed adjacent the anode, as a cathode 9.

In the last step k), the layers 13 and 14, which were applied with steps h) and i) are dissolved, while the filaments 5 in the micropassages 4 with the caps 12 and 15 remain. This dissolving process can also be controlled by the selection of the parameters of the solvent in the container so that then a foil 3 with metal filaments 5 and caps 12 and 16 at opposite sides is provided. The foil 3 has the desired properties with regard to electric conductivity.

During the galvanic filling of the passages, the following difficulties are often encountered: the electrolyte must fully wet the walls of the microscopically fine micropassages 4 and must reach the layer 6 and 8 disposed on the side 1 so that metal deposition can start uniformly in all micropassages. This however, is a difficult endeavor since the passages are very narrow and furthermore are closed at one side of the foil 3.

To improve the deposition process particularly in the passages 4, it is therefore advantageous to subject the electrolyte in the container during one or more of the steps e), f), i), or j) to ultrasound vibration and to admix a wetting agent to the electrolyte. The use of ultrasound before and during the metal deposition aids the complete filling of the passages. Also the ultrasound improves the flow in the narrow passages and in this way prevents the depletion of the metal ion concentrations in the passages. In this way, the polarization of the cathode is reduced. Also, the use of an alternating, that is, a pulsed current leads to improved metal deposition in the passages and provides for more uniform growth. The conductive material in the filled micropassages 4 with the caps 12 and 16 should also be insoluble in the solutions in which the various other layers 6, 8 and 13, 14 are dissolved. The foil 3 should not be attacked by the electrolyte medium nor by the solutions which are used to dissolve the layers 6, 8 and 13, 14.

Figure 3:
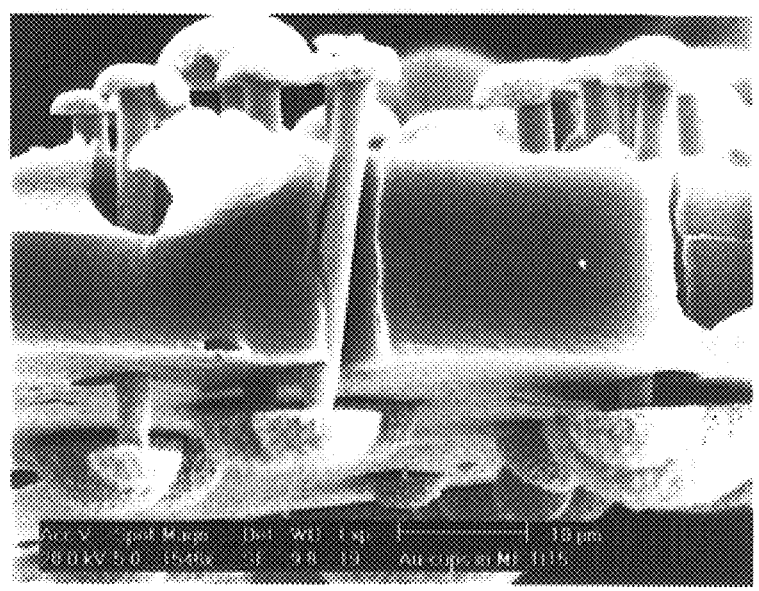

FIGS. 2 and 3 show raster-electronic microscopic images at the same location of the passages 4 with the fillings 5 and the caps 12 and 15 in two enlargement ratios. The ratio of 50 $\mu$m and, respectively, 10 $\mu$m indicated on the figures gives the size ratio.

In the given example, the foil is cut by the raster electron microscopic preparation of the representation of the transverse profile and consequently, squeezed together somewhat. This however applies only to the edge areas and is of no importance for the procedure.

What is claimed is:

1. A method of manufacturing foils of plastic or other insulating material, which are electrically conductive in a z-direction and insulating in an x/y direction, wherein the z-direction extends essentially normal to the foil plane and the x/y directions are in the plane of the foil, said method comprising the steps of:

a) irradiating a foil with a beam of high energy ions in the z-direction such that said high energy ions completely penetrate said foil and generate nuclear traces, b) etching the so-generated nuclear traces so as to provide micropassages of a desired diameter, c) applying a conductive first layer by sputtering or vapor deposition on one side of said foil with said micropassages whereby said micro passages remain open, that is, said first layer does not enter into said micropassages, d) applying an insulating cover layer to the other side of said foil, e) applying a second conductive layer onto said first conductive layer by galvanic deposition from an electrolyte and connecting said first layer as a cathode whereby said micropassages are closed by overgrowth on this one side while the micropassages as such, however, remain open, f) removing the cover layer on the other side of said foil and galvanically depositing metal ions out of an electrolyte in the micropassages from said other side wherein said second conductive layer is used as a cathode until said micropassages are completely filled forming metal filaments and caps are formed on top of the micropassages at said other side, which caps are not in contact with one another, g) dissolving the first and second conductive layers on said one side wherein, however, the metal filaments with their caps remain, h) applying a first conductive layer on said other side of said foil, where said caps are disposed, by sputtering or vapor deposition, i) galvanically depositing from an electrolyte on said other side a second conductive layer on the other conductive layer and connecting said first conductive layer as a cathode, j) galvanically depositing from an electrolyte metal ions on the filaments in said micropassages on said one side using said first conductive layer on said other side as a cathode until caps are formed on said micropassages on said one side, which caps are not in contact with one another, and k) dissolving the conductive layers applied to said other side in the steps h) and i), such that the filaments in said micropassages and the caps at the opposite ends of the micropassages remain.

2. A method according to claim 1, wherein at least during one of the steps e), f), i), and j), said electrolyte is subjected to ultrasound vibrations.

3. A method according to claim 1, wherein a wetting agent is admixed in one of said electrolytes.

4. A method according to claim 1, wherein said conductive filaments in said micropassages with said caps are not soluble in said solutions in which said layers are dissolved and said electrolytes, said solutions, and said foil are further so selected that the foil is not attacked by said electrolyte or said solutions, which are used to dissolve said layers.

5. A method according to claim 1, wherein electric current flow is applied during galvanic deposition in a pulsed fashion.

* * * * *